United States Patent
Van Beek et al.

(10) Patent No.: US 7,176,550 B2
(45) Date of Patent: Feb. 13, 2007

(54) METHOD AND DEVICE FOR FORMING A WINDING ON A NON-PLANAR SUBSTRATE

(75) Inventors: Jozef Thomas Martinus Van Beek, Eindhoven (NL); Theodoor Gertrudis Silvester Maria Rijks, Eindhoven (NL); Marion Kornelia Matters-Kammerer, Limbricht (DE); Henricus Andreas Van Esch, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/486,453

(22) PCT Filed: Aug. 14, 2002

(86) PCT No.: PCT/IB02/03230

§ 371 (c)(1),
(2), (4) Date: Feb. 10, 2004

(87) PCT Pub. No.: WO03/017479

PCT Pub. Date: Feb. 27, 2003

(65) Prior Publication Data

US 2004/0232519 A1    Nov. 25, 2004

(30) Foreign Application Priority Data

Aug. 14, 2001    (EP)    ................ 01203071

(51) Int. Cl.
*H01L 29/00*    (2006.01)

(52) U.S. Cl. ............... 257/528; 257/531; 257/532; 257/499; 257/E27.009

(58) Field of Classification Search ............... 257/277, 257/531, 532, 533, 534, 535
See application file for complete search history.

(56) References Cited

U.S. PATENT DOCUMENTS 5,969,405 A * 10/1999 Aeugle
5,969,422 A * 10/1999 Ting et al.
5,998,838 A * 12/1999 Tanabe et al.

FOREIGN PATENT DOCUMENTS

WO    WO9716836    5/1997
WO    03017479    2/2003

* cited by examiner

*Primary Examiner*—Nathan J. Flynn
*Assistant Examiner*—Kevin Quinto (57) ABSTRACT

The electronic device (10) comprises a capacitor (12) and an inductor (11) and is present on a substrate (1) with an unplanarized surface (2). This is realized in winding (21) of the inductor (11) has a thickness of at least 1 micron and has a planarized upper surface (81). The upper electrode (32) of the capacitor is present in a second electrode layer (6) and has a lower surface (82) which is spaced from the substrate (1) by a larger distance than the upper surface (81) of the lower electrode (31). The second electrode layer (6) preferably includes a second winding (22) of the inductor (11). The electronic device (10) is suitable for use at high frequencies.

10 Claims, 4 Drawing Sheets

METHOD AND DEVICE FOR FORMING A WINDING ON A NON-PLANAR SUBSTRATE

The invention relates to a method of manufacturing an electronic device comprising a substrate with on a surface thereof a capacitor and an inductive element, which capacitor includes a first electrode and a second electrode and an intermediate dielectric, and which inductive element comprises a first winding.

The invention also relates to an electronic device comprising a capacitor and an inductive element, which capacitor includes a first electrode and a second electrode and an intermediate dielectric and which inductive element comprises a first winding, which device comprises a substrate on a surface thereof are present:
- a first metal film, in which the first winding of said inductive element and the first electrode of the capacitor are defined;
- a second metal film comprising the second electrode of the capacitor;
- a dielectric film of a dielectric material, part of which is the dielectric.

The invention further relates to a multilayer substrate with internal conductors provided with a measurement structure for measurement of a dielectric constant of a dielectric.

The invention further relates to a method of testing an electronic device comprising an insulating body with internal conductors and layers of dielectric material, the device being designed to operate at frequencies of more than 100 MHz, which method including the determination of a dielectric property of a layer of dielectric material with a measurement structure.

Such a device is known from WO-A-97/16836. The known device is a transformer which has been manufactured by means of thin film technology. The second metal film, which is deposited directly on the planarized surface of the substrate, comprises gold and has a thickness of less than 100 nm. Defined in the second metal film are the first electrode of the capacitor, bond pads and interconnects, which interconnects intersect the coupled inductor. The first metal film of the known device comprises copper and has a thickness of 2–5 micron. This renders the device suitable for use at high frequencies in the microwave and rf range. The device furthermore comprises a third metal film, which likewise comprises copper and has a thickness of 2–5 micron. Said third metal film is separated from the first metal film by a separation layer. Said separation layer comprises an organic material having a low dielectric constant and has a thickness of 2–30 micron. Because of the low dielectric constant and the great thickness of the separation layer, the capacitive coupling between the first and the second element of the coupled inductor in the known device is only small, even at high frequencies. This renders the known device suitable for use in RF applications, in particular as a balanced-to-unbalanced transformer, also known as a balun transformer.

It is a drawback of the known device that the substrate must have a planarized surface. If such is not the case, premature failure of the—thin film—capacitor will occur upon application of an electric field.

Thus it is a first object of the invention to provide a method of manufacturing an electronic device of the kind mentioned in the introduction, which is suitable for use in RF applications, and in which planarisation of the substrate is not necessary.

It is a second object of the invention to provide a device of the kind referred to in the introduction, which is suitable for use in RF applications and for which the substrate can be chosen freely, since no substrate planarisation is required.

The first object is achieved in that the method comprises the steps of:
- providing a first metal film on the surface of the substrate, in which first metal film are defined the first electrode of the capacitor and the first winding of the inductive element;
- providing a dielectric film of dielectric material on the first metal film;
- providing a separation layer of dielectric material on the dielectric film in a desired pattern, such that the separation layer covers the first winding and that a perpendicular projection of the separation layer on the first metal film falls partially within the first electrode; and
- providing a second metal film on the dielectric film and the separation layer, in which second metal film is defined the second electrode of the capacitor.

Because both the first electrode and the first winding are defined in the first metal film on the substrate surface, the first metal film will have a substantial thickness, hence it was found that no planarisation of the substrate is necessary. The thickness however may lead to a non-uniformess of the capacitor, particularly since an interconnection track interconnecting the second electrode will be present next to the first capacitor electrode. This would lead to a so-termed "step coverage". Such non-uniformess is prevented in the provision of the separation layer.

In a suitable embodiment, the first and second metal film are provided by applying a seed layer and growing the film to a desired thickness with electroplating. The use of electroplating has the advantage that it is a technique that can be well integrated with IC processing, such as damascene and dual-damascene. Further on, the thicknesses larger than 1 micron, preferably 3 to 8 micron, are well achievable. Besides, even if the seed layer does not coat the underlying surface completely, the resulting electroplating step will result in the metal film as desired.

In a further embodiment a brightener is added to the electrochemical batch used for the electroplating. It has turned out that the resulting metal film, when comprising said brightener, is also capable of smoothening substrates that exhibit a high degree of roughness. A high degree of roughness is characterized by, for example, a variation of the surface in the direction perpendicular to the stack of layers—the z-direction—of 3 micron or more. An additional advantage of the use of a brightener is that the bath can be operated at higher current values, which accelerates the deposition of metal, particularly copper.

Advantageous examples of substrates exhibiting a high degree of roughness are sintered ceramic substrates, such as alumina, AlN and Low-Temperature Cofired Ceramic—or LTCC—substrates. Such substrates have distinct advantages over substrates of for example, silicon or glass: the electric losses which occur at high frequencies are lower than the electric losses of silicon substrates; the thermal conduction is better than that of glass substrates, and in addition, said substrates are cheaper.

It will be understood that further embodiments are possible. Particularly with copper as material of the metal films, it is suitable to provide barrier layers. Also, an additional separation layer, to be applied before the first metal film, may be present between the patterns in the first metal film, and result in a planarized surface of this layer and the first metal film. Also, the metal films, the dielectric film and the separation layer may be part of a multilayer stack, that can be used as a substrate on its own. Further on, additional elements may be provided into the first and second metal films, so as to improve the quality, and make interconnects.

The second object to provide a device of the kind referred to in the introduction is achieved in that:

the first metal film is present between the surface of the substrate and the dielectric film and has a thickness that is larger than a penetration depth at a minimal operation frequency;

a patterned separation layer of a dielectric material is present between the first and the second metal film, which separation layer has a smaller capacitance density than the dielectric film, and a perpendicular projection of the separation layer on the first metal film falls partially within the first electrode of the capacitor.

Due to the thick layer—preferably of copper—, it is not necessary to provide at least one of the electrodes of the capacitor in a separately applied, thin layer, on a planarized substrate. Instead thereof, the capacitor electrodes are applied in the same metal films as other elements, such as windings of inductive elements, interconnect tracks, vertical interconnect areas, transmission lines and the like. An optimum thickness of the metal film is a thickness of about twice the penetration depth. At such a thickness the current that penetrates up to the penetration depth, is the least disturbed, while the coupling between tracks within the same film is minimal. And the higher the current, the higher the Q-factor of the inductor and the lower the Equivalent Series Resistance, briefly ESR, of the capacitor. At an operating frequency of 1 GHz, said penetration depth is 2–3 micron, depending on the metal used in the metal film. At 10 GHz, said penetration depth is less than 1 micron.

Besides, due to the patterning of the separation layer and the dielectric film, the coupling between the first and the second metal film can be tuned to desire: either direct contact—neither separation layer, nor dielectric film—or capacitive coupling—only dielectric film—or only inductive coupling—separation layer with or without dielectric film.

Since no additional thin layer is necessary for a capacitor electrode, the device of the invention may well be a multilayer structure with copper layers, such as a multilayer interconnect structure of an integrated circuit and a multilayer structure of a multilayer substrate of ceramic or resin material.

It is preferred that the capacitance density of the separation layer is at least ten times lower than that of the dielectric film. Said capacitance density, which is also known by the term dielectric thickness, equals the ratio between the dielectric constant and the thickness of the layer of dielectric material. Preferably, the separation layer has a capacitance density of less than 30 pF/mm$^2$, more preferably less than 10 pF/mm$^2$ and even more preferably less than 3 pF/mm$^2$. A capacitance density of 3 pF/mm$^2$ can be realized by depositing a low-K material in a thickness of 8 micron or more. Examples of low-K materials are, for example, benzocyclobutene, polyimide, porous silica and silsesquioxane. Preferably, the dielectric film has a capacitance density of more than 80 pF/mM$^2$, more preferably more than 150 pF/mm$^2$. A capacitance density of 150 pF/mm$^2$ can inter alia be realized by using SiN$_x$ in a thickness of about 0.4 micron as the dielectric material.

In a first embodiment, the inductive element comprises a second winding, that is present in the second metal film and separated from the first winding through the separation layer. Through the use of an inductive element with more than one winding, the surfacial area of the inductive element can be substantially reduced. Further on, the first and the second winding need not to be interconnected, but form the first and the second coils of a transformer. The separation layer determines the distance between the first and the second winding, therewith minimizing undesired capacitive coupling and maximizing inductive coupling.

The inductive element of this first embodiment is for instance a coupled inductor, which preferably forms part of a balun transformer. Such transformers may have a resonance frequency of about 2–2.4 GHz, which renders them suitable for use in according with various telecommunication protocols, such as Bluetooth, W-LAN, W-CDMA and the like.

The inductive element can be an coil as well. The first and the second winding are interconnected in that case. Preferably, a third and a fourth winding are present in, respectively, the first and the second metal film. With such an inductive element, inductance values of 25–35 nH can be realized on a surface area of 1 mm$^2$, and the Q-factor is 30 or more. Apart from a coil having a large inductance, the inductive element may alternatively be a coil having a relatively small surface area. The surface area of the coil comprising two windings in two metal films has been reduced by 50% in comparison with a coil comprising one or more windings in only one metal film.

In a further embodiment, the dielectric material of the separation layer is air. In this way, inductors comprising an air gap are obtained. Air has the advantage of having a very low dielectric constant of 1. The capacitance between the first and the second winding of the inductive element is very small in that case. This embodiment can be realized by depositing a soluble material such as a photoresist in a desired thickness as the separation layer. After application and patterning of the second metal film, said material can be dissolved in a solvent which does not affect the dielectric material of the dielectric film. Spacers of a third material, for instance silicon oxide, can be provided to support the second metal film as far as necessary.

In another embodiment, which is particularly preferred in combination with the embodiment with an inductive element comprising a first and a second winding, the substrate comprises a layer of semiconductor material wherein a plurality of semiconductor elements are defined that are interconnected so as to form an integrated circuit. This implies that the inductive element and the capacitor are part of the interconnect structure of the integrated circuit. The device of the invention is very suitable therefor. First of all, its manufacture is compatible, since the only metal layers that are present are metal layers of standard available materials, such as copper, and also the dielectric layers are of material that is known in semiconductor processing. Secondly, it uses only a limited number of layers, that can be used for interconnection purposes as well. The interconnect structure, that usually comprises 4–6 metal layers, does not need to be extended to a larger number of layers. Thirdly, the lateral dimensions of the structure is relatively limited, so that it fits into the surfacial area of the integrated circuit and lets space left for interconnects.

In yet another embodiment, a micro-electromechanical component—also known as MEMS components—is present. To that end, the device comprises a first MEMS electrode and a second MEMS electrode, the first and the second MEMS electrode being present in, respectively, the first and the second metal film. The first and the second MEMS electrode are separated from each other by the separation layer and a layer of air. Alternatively, the separation layer maybe of air. Microelectromechanical components may be used at various places in the front end of a mobile telephone, inter alia as a switch, a resonator, a filter and an adjustable capacitor. More in particular a MEMS component may be used for adjusting the output impedance of an impedance matching circuit and for adjusting the resonance frequency of a voltage controlled oscillator. (VCO) tank circuit.

In again another, but very suitable embodiment, the capacitor and the inductive element are part of a measurement structure, wherein the first winding of the inductive element interconnects the first and the second electrode of the capacitor, and the measurement structure further comprises a first and a second transmission line, which lines are defined in the second metal film, are located substantially parallel to each other and perpendicular projections of the lines on the first metal film overlap with the first winding.

In the resonant structure of inductor and capacitor a small signal is provided by inductive and capacitive coupling from one of the transmission lines. The amount of coupling therein is so small that the LC-structure is hardly influenced. The transmission of this signal to the second transmission line is measured as a function of the frequency. At the resonance frequency a strong transmission takes place. It has been found that the position of this resonance is influenced by the capacitor. Such could be expected at low frequencies, but is unexpected for RF applications. By comparison with a reference value, the quality of the capacitor can be controlled. Such is particularly important for multilayer substrates.

The measurement structure in the device of the invention has considerable advantages over known measurement structures for the measurement of the dielectric constant. First of all, the size of the structure is considerably reduced. In comparison with a ring-shaped resonator the necessary surface area is reduced 50 times at 1.8 GHz, 20 times at 2.4 GHz and about 6 times at 4.5 GHz. Secondly, the dielectric constant can be obtained without any information on the layers around the capacitor.

The invention also relates to a multilayer substrate with internal conductors provided with a measurement structure for measurement of a dielectric constant of a dielectric.

The invention further relates to a method of testing an electronic device comprising an insulating body with internal conductors and layers of dielectric material, the device being designed to operate at frequencies of more than 100 MHz, which method including the determination of a dielectric constant of a layer of dielectric material with a measurement structure.

Such a method and such a multilayer substrate are for instance known from D. I. Amey & S. J. Horowitz, "Test Characterise High Frequency Material Properties", Microwave & RF, August 97, and also "Microwave Material Characterisation", *Proc. Int. Symposium on Microelectronics* (*ISHM*) 1996, 494–499.

In the known method use is made of stripline, T- and ringresonators as measurement structures, particularly for frequencies above 1 GHz. Such resonators are provided with special metallizations on the dielectric layer to be measured. The result thereof is the magnitude of a transferred signal from entrance to exit of the measurement structure.

It is a disadvantage of the known structure, that the electrical field is spreaded over all layers of a multilayer substrate. The position of the resonance frequency and the width of the resonance curve depend on the thickness when and the type of layers of all layers in the multilayer stack. When measuring, it is therefor necessary to calculate first the environmental contribution, also called the effective dielectric constant. Only thereafter, the relation between this effective dielectric constant and the real structure can be found out, which is quite complicated.

It is therefore a third object of the invention to provide a multilayer substrate of the type referred to in the introduction, with an improved measurement structure.

It is a fourth object of the invention to provide a measurement method that is less complicated and provides direct results.

The third object is realized in that it comprises:
a capacitor having a first and a second electrode and the intermediate dielectric,
an inductive element having a first winding, wherein the first winding interconnects the first and the second electrode of the capacitor;
a first and a second transmission line, which lines are located parallel to each other and are capacitively and inductively coupled to the first winding of the inductive element.

In the resonant structure of inductor and capacitor a small signal is provided by inductive and capacitive coupling from one of the transmission lines. The amount of coupling therein is so small that the LC-structure is hardly influenced. The transmission of this signal to the second transmission line is measured as a function of the frequency. At the resonance frequency a strong transmission takes place. It has been found that the position of this resonance is influenced by the capacitor. Such could be expected at low frequencies, but is unexpected for RF applications. By comparison with a reference value, the quality of the capacitor can be controlled. Such is particularly important for multilayer substrates.

The measurement structure in the device of the invention has considerable advantages over known measurement structures for the measurement of the dielectric constant or other dielectric properties. First of all, the size of the structure is considerably reduced. In comparison with a ring-shaped resonator the necessary surface area is reduced 50 times at 1.8 GHz, 20 times at 2.4 GHz and about 6 times at 4.5 GHz. Whereas ring-resonators have a diameter in the order of centimeters, the structure of the invention can be will provided on an surface area of about 0.3*0.3 cm, more or less frequency independent. Secondly, the dielectric constant can be obtained without any information on the layers around the capacitor. Th electric field is in this case only present between the capacitor electrodes.

Preferably the substrate is provided with a first and a second metal film, the first metal film comprising the first electrode of the capacitor and the first winding of the inductive element, the second metal film comprising the second electrode of the capacitor and the transmission lines, the first and second metal film being mutually separated through a dielectric film of dielectric material constituting the dielectric of the capacitor and a separation layer of dielectric material being at least present between the first winding of the inductive element and the transmission lines. This structure has been found to be very well applicable for this object. In a further embodiment, a perpendicular projection of the separation layer on the first metal film falls partially within the first electrode of the capacitor.

The fourth object is achieved in that the device or the multilayer substrate according to the invention is tested and its measurement structure is used to measure the resonance frequency, which is compared to a reference value and converted to a desired quantity, such as the dielectric constant or the dielectric loss. Under the conditions that surface area of the capacitor and inductance are the same in both reference and measurement, the conversion of resonance frequency $f_{res}$ to dielectric constant $\epsilon$ or dielectric thickness $\epsilon/d$ is done with: $(\epsilon/d)_{device} = (\epsilon/d)_{reference} (f_{res,\ reference}/f_{res,\ device})^2$. Herein, the subscript reference indicates the reference value and the subscript device indicates the value of the sample that is actually measured. Data on the dielectric loss (ordinarily expressed as tan δ) can be obtained from the resonance frequency and the resonance width $\Delta f_{3\ dB}$: $\tan \delta = (\Delta f_{3\ dB}/f_{res})_{device} - (1/Q)_{metal,\ reference}$; wherein the Q is Q-factor for the metal film of the reference. Further details and embodiments thereof will be clear to the skilled person.

These and other aspects of the method of manufacturing and the electronic device will now be explained in more detail by means of embodiments and drawings. The drawings are diagrammatic representations, not to scale, in which like numerals indicate like parts. In the drawings.

Figure 1:
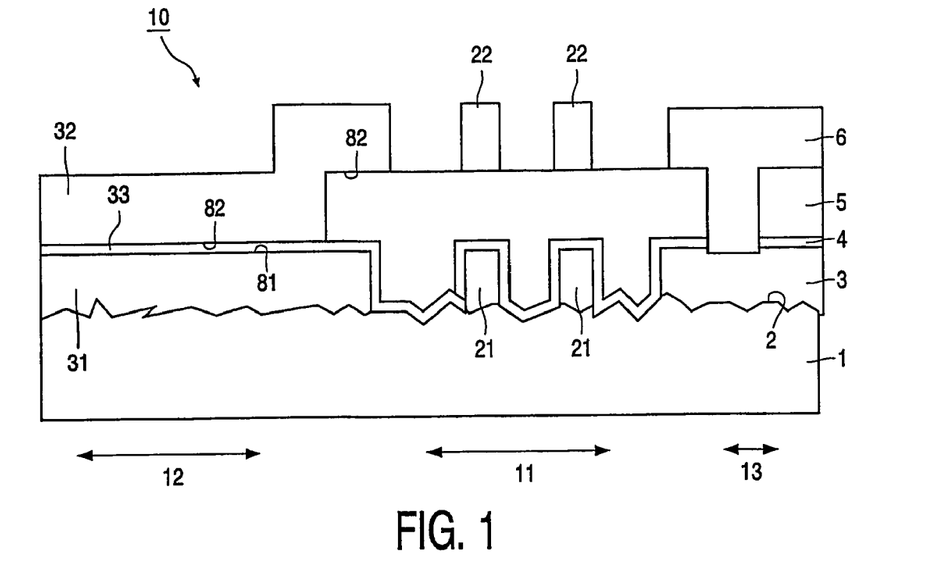
FIG. 1 is a diagrammatic sectional view of the device.
Figure 2:
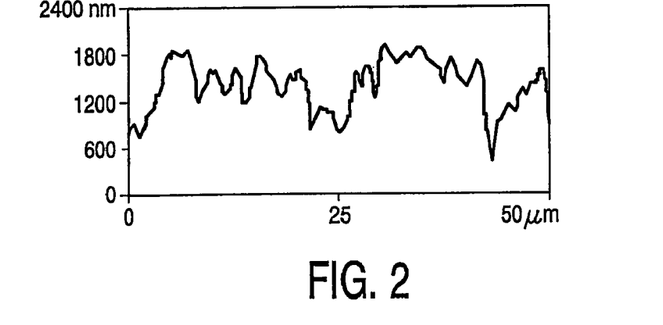
FIG. 2 shows a roughness profile of the non-planarized substrate.
Figure 3:
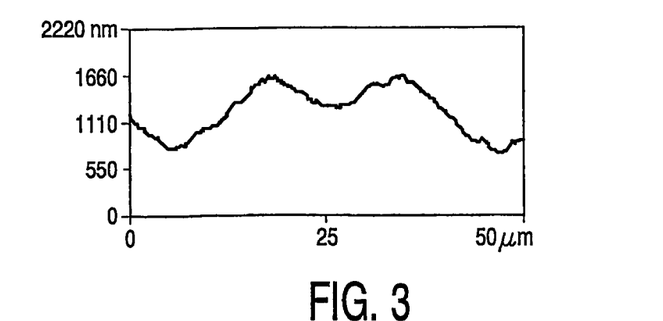
FIG. 3 shows a roughness profile of the substrate coated with the first metal film.

The electronic device 10 which is shown in FIG. 1 comprises a substrate 1 having a surface 2. The substrate 1 comprises alumina. Present on the surface 2 is a first metal film 3, which comprises copper and which has a thickness of 5 micron. FIG. 2 shows a roughness profile of the non-planarized substrate 1. Both sectional views have been obtained by means of Atomic Force Microscopy. The length of the section is plotted on the x-axis. The height of the surface is plotted on the y-axis. The figures give an impression of the roughness of the substrate; it should be noted that the scale of the x-axis is smaller than the scale of the y-axis. The surface 2 of the non-planarized substrate 1 exhibits variations in height ranging between 500 and 1900 nm. The surface is peaked, the peaks having a width in the order of 1–4 micron. The gradient of the peaks is in the order of 400–800 nm per micron of length. The surface of the first electrode layer 3 exhibits variations in height ranging between 700 and 1650 nm. The surface slopes gradually, with a gradient in the order of 70 nm per micron. The extremes are spaced about 10 micron apart. Upon comparison of the two surfaces it appears that the first metal film 3 planarizes the surface 2 of the substrate 1.

As is shown in FIG. 1, the first metal film 3 is coated with a dielectric film 4, which in this case comprises $SiN_x$ having a relative dielectric constant of 6.5 and which has a thickness of 400 nm. Present on the dielectric film 4 is the separation layer 5, which in this case comprises benzocyclobutene having a relative dielectric constant of 2.7 and which has a thickness of 10 micron. Present on the separation layer 5 is the second metal film 6, which comprises copper and which has a thickness of about 5 micron. The metal films 3,6, the dielectric film 4 and the separation layer 5 are all patterned in accordance with a desired pattern, with an inductive element 11, a capacitor 12 and a via 13 being defined.

The inductive element 11 comprises a first portion 21 in the first metal film 3 and a second portion 22 in the second metal film 6. The first and the second portion 21,22 are inductively coupled as a result of the second portion 22 substantially overlapping, and in this case essentially coinciding with, the first portion 21 upon perpendicular projection on the first metal film 3. There is no or at least no significant capacitive coupling between the first and the second portion 21,22 of the inductive element 11, because of the presence of the separation layer 5 between said portions. The dielectric film 4 is also present, but its influence on the capacitance between the two portions 21,22 is only small.

The capacitor 12 includes a first and a second capacitor electrode 31,32 present in, respectively, the first and the second metal film 3,6. A dielectric 33 consisting of the dielectric film 4 is present between the lower and the upper electrode 31,32 of the capacitor 12. Part of the lower surface 82 of the upper electrode 32 is in contact with the dielectric film 4, and another part is in contact with the separation layer 5. The lower surface 82 is positioned above the upper surface 81 of the lower electrode 31 in its entirety.

The via 13 is formed at places where both the separation layer 5 and the dielectric film 4 have been removed by patterning.

Embodiment 1

The device that is shown in FIG. 1 is formed in the following way. The surface 2 of the substrate 1 is coated with a seed layer of copper in a thickness of 200 nm by means of a sputtering technique. Then a photoresist is deposited, exposed via a first mask and developed. Following this, copper is grown thereon by means of an electroplating process. The device—insofar as it has been formed—is to that end immersed in an aqueous bath containing $Cu^{2+}$ ions, counter ions and a brightener. Copper is separated by means of a galvanic process. As a result of the addition of the brightener, the grain size of the copper remains limited. As a result, a copper film having a smooth upper surface is obtained.

After completion of the electroplating process and after the first metal film 3 has been formed in a desired pattern, the photoresist and the seed layer present under said photoresist are removed. The surface of the metal film 3 is cleaned. The dielectric film 4 of $SiN_x$ is deposited and patterned by means of a photoresist, exposure, etc. Then the separation layer 5 is spin-coated thereon. The separation layer is a layer of benzocyclobutene comprising a photosensitive component. The separation layer 5 is dried and, after exposure, developed in a manner which is usual for benzocyclobutene. Since benzocyclobutene has a planarizing effect, polishing is not necessary. Subsequently, the second metal film 6 is deposited in the same way as the first metal film 3.

The device 10 is now complete. If bond pads are desired, a film of Au may be coated onto the second metal film 6. The presence of a barrier layer between the second metal film 6 and the film of Au is not required.

Embodiment 2

The surface 2 of substrate 1 is coated with the first metal film 3 in the manner described in embodiment 1. Then the device is placed in a plasma-enhanced chemical vapor deposition (PECVD) reactor. In said reactor, an $SiO_2$ film is first deposited in a thickness of 200 nm via a mask. This is done by depositing trimethyl silane and $N_2O$ in a proportion of 1:20 or 1:30. Deposition rates range between 10 and 60 sscm for the silane and between 200 and 1800 sscm for the $N_2O$. The temperature ranges between 150 and 400° C., the pressure between 2 and 10 Torr and an RF power between 50 and 250 Watt is used. Subsequently, the mask is substituted with a second mask and the ratio between the two gas flows is changed into a ratio ranging between 1:3 to 1:7. This results in an intermediate layer of methyl-doped SiO. Deposition rates range between 10 and 60 sscm for the silane and between 30 and 360 sscm for the $N_2O$. Following this, a spin-on dielectric, such as methyl silsesquioxane (MSQ) or hydrogen silsesquioxane (HSQ) is deposited. MSQ has a relative dielectric constant of 2.9, and its empirical formula is $CH_3SiO_{1.5}$. Since MSQ and PECVD-$SiO_2$ do not bond together very well, the MSQ not present on the intermediate layer can be removed. Subsequently, the second metal film is deposited in the manner described in embodiment 1.

Embodiment 3

The surface 2 of substrate 1 is coated with the first metal film 3 and the dielectric film 4 in the manner described in embodiment 1. Then a layer of an insulating material is deposited thereon and patterned, so that only a few supporting structures remain. Subsequently, a photoresist, such as HPR506, is spin-coated thereon in a thickness of 2 micron. During said deposition, it is ensured that the upper sides of the supporting structures are level with the photoresist. Following that, the second is metal film 6 is deposited and patterned. Then the photoresist is removed by placing the device in an acetone bath.

Embodiment 4

Figure 4A:
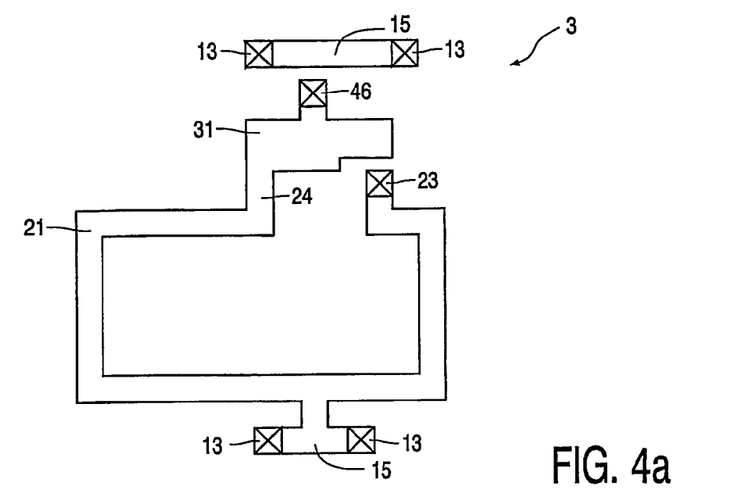
FIGS. 4a and 4b are diagrammatic top plan views of the electrode layers of one embodiment of the invention.
Figure 4B:
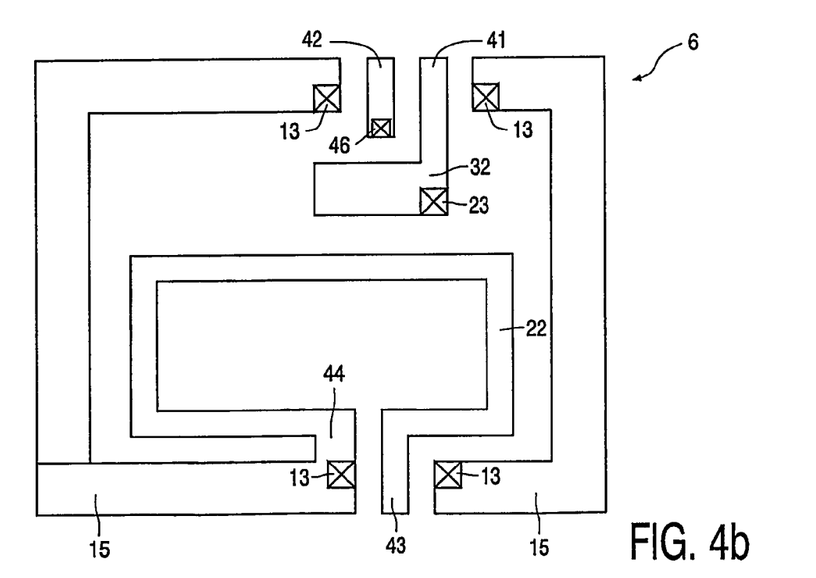
Figure 5:
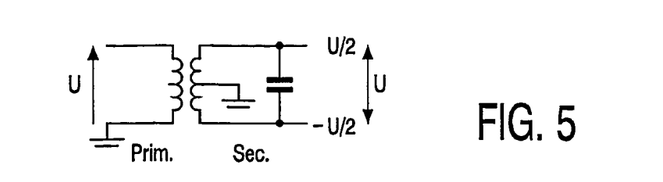
FIG. 5 shows an electric diagram equivalent to the embodiment of FIG. 4.

FIG. 4 shows an embodiment of the electronic device 10 according to the invention. FIG. 5 shows the electrical equivalent of FIG. 4. FIG. 4a shows the first electrode film 3. FIG. 4b shows the second electrode film 6. The embodiment as shown is a balun. Said balun includes the inductive element 11 and a capacitor 12. Furthermore, a grounded pattern 15 is present, as well as gates 41, 42, 43, 44. The second winding 22 of inductive element 11 is connected to the grounded pattern 15 via gate 44. The grounded pattern 15 is largely contained within the second metal film 6. At the gates 41, 42, 43, however, the pattern 15 is contained within the first metal film 3. Vias 13 provide the interconnection between the parts of the pattern 15. The first winding 21 of inductive element 11 is connected to the upper electrode 32 of the capacitor 12 at a first end 23. The first winding of inductive element 11 is connected to the lower electrode 31 of the capacitor 12 at a second 24. The gate 42 is connected to the lower electrode 31 of the capacitor 12 by means of via 46. A substantial overlap with the first winding 21 occurs upon perpendicular projection of the second winding 22 of the inductive element 11 on the first metal film 3. The measuring results that have been obtained are shown in table 1.

TABLE 1

Measured resonance frequency $F_{res}$, insertion loss IL (measured on single and back-to-back baluns), difference in phase at the resonance frequency of the baluns for various inductor areas and line widths.

| No. | Area (mm$^2$) | line Width (μm) | $F_{res}$ (GHz) | IL @ $F_{res}$ (dB) single/b.t.b. | Difference of phase at $F_{res}$ (Deg) |
|---|---|---|---|---|---|
| 1 | 0.5 × 0.5 | 25 | 2.2 | 1.1–1.3/1.2 | 183 |
| 2 | | 50 | 2.2 | 0.7/0.7 | 183 |
| 3 | | 100 | 2.3 | 0.5–0.6/0.6 | 183 |
| 4 | 0.75 × 0.75 | 25 | 2.3 | 1.0–1.3/1.1 | 173 |

TABLE 1-continued

Measured resonance frequency $F_{res}$, insertion loss IL (measured on single and back-to-back baluns), difference in phase at the resonance frequency of the baluns for various inductor areas and line widths.

| No. | Area (mm$^2$) | line Width (μm) | $F_{res}$ (GHz) | IL @ $F_{res}$ (dB) single/b.t.b. | Difference of phase at $F_{res}$ (Deg) |
|---|---|---|---|---|---|
| 5 | | 50 | 2.1 | 0.7–0.8/0.6 | 183 |
| 6 | | 100 | 2.2 | 0.5/0.4 | 182 |
| 7 | 1.0 × 1.0 | 25 | 2.3 | 1.3–1.8/1.5 | 185 |
| 8 | | 50 | 2.1 | 0.6–0.8/0.6 | 184 |
| 9 | | 100 | 2.2 | 0.5–0.6/0.3 | 183 |
| 10 | | 100 (*) | 2.3 | 0.2/0.3 | 179 |

The measurement indicated (*) comprises 50 Ω SMD contacts rather than 50 Ω RF probes.

Embodiment 5

Figure 6:
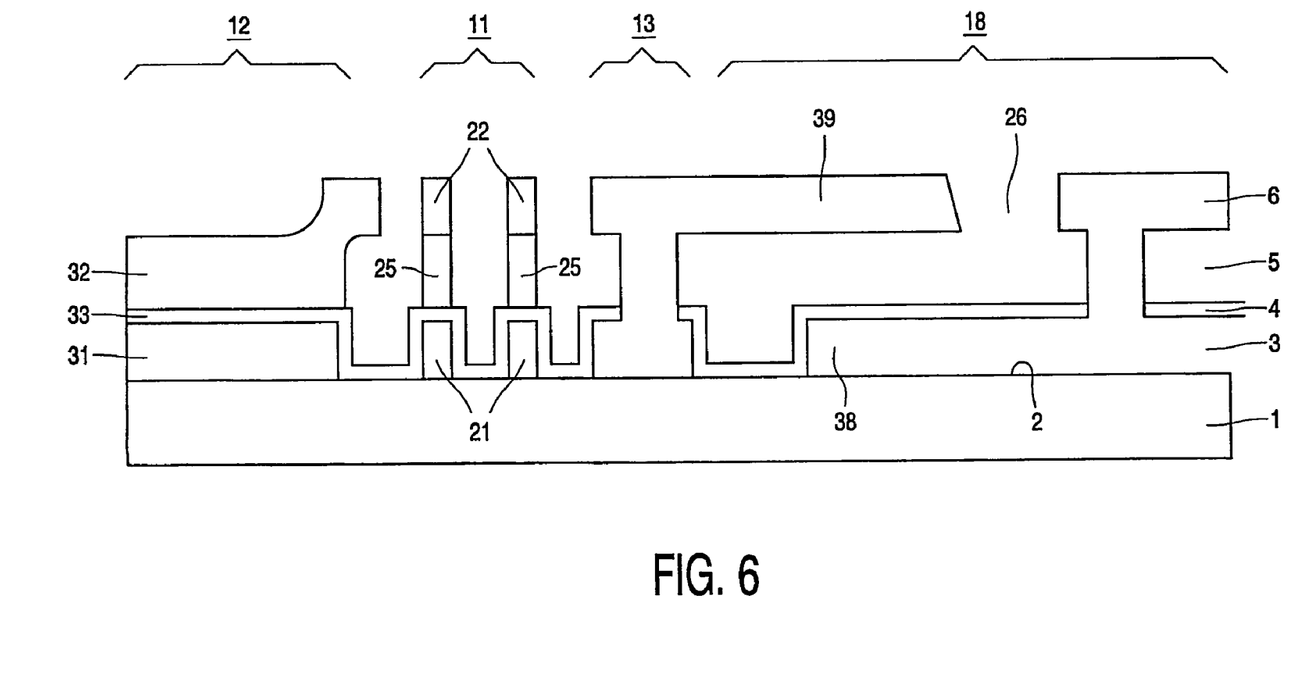
FIG. 6 is a diagrammatic sectional view of a second embodiment.

FIG. 6 shows a second embodiment of the device 10 according to the invention. In this case, the dielectric material is preferably a silicon oxide $SiO_x$, which has been deposited in a thickness of 1.0 micron by means of plasma-enhanced chemical vapour depostion. Prior to the deposition of the separation layer 5, supporting structures 25 are formed from a photoresist material, such as HPR506. Then a second electrode film 6 of Al is deposited. Said film is coated with a photoresist, which is developed in accordance with the desired pattern. Besides the upper electrodes 32 of the capacitor 12 and the second winding 22 of the inductive element 11, also access holes 26 are defined in this manner. The Al is removed by dry etching in a chlorine plasma. Then the photoresist is removed. Following this, the silicon oxide is removed by means of an etchant comprising $NH_4F$, acetic acid, ethylene glycol and water. This is followed by rinsing with $H_2O$ and drying with isopropanol.

The result is a device comprising an inductive element 11, a thin film capacitor 12, vias 13 and a micro-electromechanical (MEMS) element 18. The MEMS element 18 comprises a first MEMS electrode 38 in the first metal film 3 and a second MEMS electrode 39 in the second metal film 6. Present between the MEMS electrodes 38,39 are the dielectric film 4 and a layer of air. The MEMS element 18 is stabilized by the vias 13.

Figure 7:
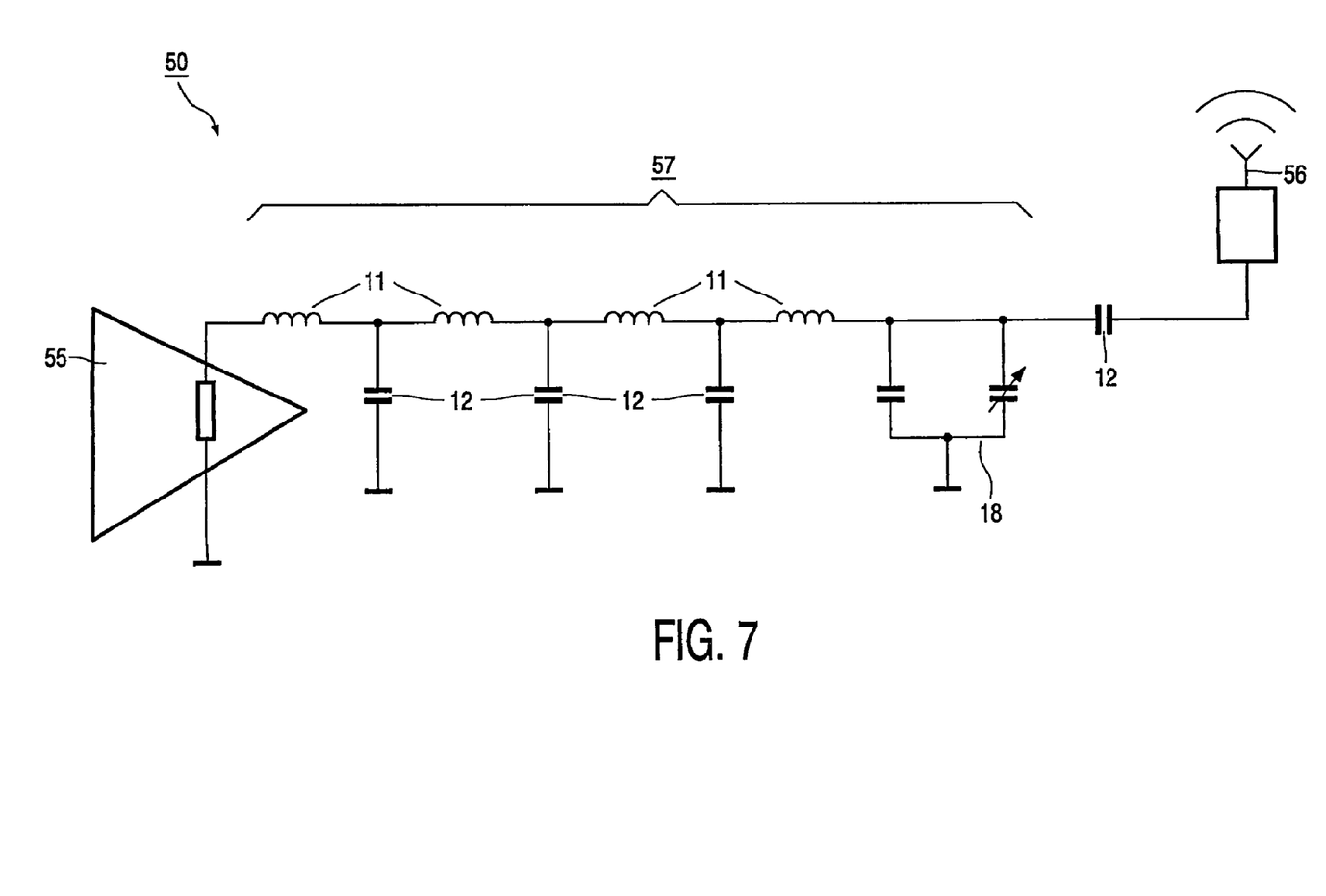
FIG. 7 shows an electric diagram of the second embodiment.

FIG. 7 shows an electric diagram of the device according to the invention incorporating the MEMS element 18. In this case, the device 50 is an RF front end comprising a power amplifier 55, thin film capacitors 12, inductive elements 11 and an antenna 56. The MEMS element forms part of the impedance matching circuit 57. The MEMS element 18 enables adjustment of the output impedance in this application.

The invention claimed is:

1. An electronic device (10,50) comprising a capacitor (12) and an inductive element (11), which capacitor (12) includes a first electrode (31) and a second electrode (32) and an intermediate dielectric (33), and which inductive element (11) comprises a first winding (21),
which device (10,50) comprises a substrate (1), on a surface (2) of which there are present:
a first metal film (3), in which the first winding (21) of said inductive element (11) and the first electrode (31) of the capacitor (12) are defined;
a second metal film (6) comprising the second electrode (32) of the capacitor (12);

a dielectric film (4) of a dielectric material, part of which is the dielectric (33), characterized in that:

the first metal film (3) is present between the surface (2) of the substrate and the dielectric film (4) and has a thickness that is larger than a penetration depth at a minimal operation frequency;

a patterned separation layer (5) of a dielectric material is present between the first and the second metal film (3,6), which separation layer (5) has a smaller capacitance density than the dielectric film (4), and a perpendicular projection of the separation layer (5) on the first metal film (3) falls partially within the first electrode (31) of the capacitor (12).

2. An electronic device (10,50) as claimed in claim 1, characterized in that the inductive element (11) comprises a second winding (22), that is present in the second metal film (6) and separated from the first winding (21) through the separation layer (5).

3. An electronic device (10,50) as claimed in claim 1, characterized in that the substrate (1) comprises a layer of semiconductor material wherein a plurality of semiconductor elements are defined that are interconnected so as to form an integrated circuit.

4. An electronic device (50) as claimed in claim 1, characterized in that a microelectromechanical component (18) comprising a first MEMS electrode (38) and a second MEMS electrode (39) is present, said first and said second MEMS electrode (38,39) being present in, respectively, the first and the second metal film (3,6), and the dielectric layer (4) and a layer of air being present between the first and the second MEMS electrode (38,39).

5. An electronic device (10) as claimed in claim 1, characterized in that the capacitor (12) and the inductive element (11) are part of a measurement structure, wherein the first winding (21) of the inductive element (11) interconnects the first and the second electrode (31,32) of the capacitor (12), and the measurement structure further comprises a first and a second transmission line, which lines are defined in the second metal film (6), are located substantially parallel to each other and perpendicular projections of the lines on the first metal film (3) overlap with the first winding (21).

6. An electronic device (10,50) as claimed in claim 1, characterized in that the capacitance density of the dielectric film (4) is at least ten times higher than that of the separation layer (5).

7. An electronic device (10,50) as claimed in claim 6, characterized in that the first and second metal film (3,6) each have a thickness larger than 1 micron.

8. A multilayer substrate with internal conductors provided with a measurement structure for measurement of a dielectric constant of a dielectric comprising:

a capacitor (12) having a first and a second electrode (31,32) and the intermediate dielectric (33), an inductive element (11) having a first winding (21), wherein the first winding (21) interconnects the first and the second electrode (31,32) of the capacitor (12);

a first and a second transmission line, which lines are located parallel to each other and are capacitively and inductively coupled to the first winding (21) of the inductive element (11).

9. A multilayer substrate as claimed in claim 8, characterized in that the substrate is provided with a first and a second metal film (3,6), the first metal film (3) comprising the first electrode (31) of the capacitor (12) and the first winding (21) of the inductive element (11), the second metal film comprising the second electrode (32) of the capacitor (12) and the transmission lines, the first and second metal film (3,6) being mutually separated through a dielectric film (4) of dielectric material constituting the dielectric (33) of the capacitor and a separation layer (5) of dielectric material being at least present between the first winding (21) of the inductive element (11) and the transmission lines.

10. A method of testing an electronic device comprising an insulating body with internal conductors and layers of dielectric material, the device being designed to operate at frequencies of more than 100 MHz, which method including the determination of a dielectric property of a layer of dielectric material with a measurement structure, characterized in that the device (10) according to claim 9 is tested and its measurement structure is used to measure the resonance frequency, which is converted to the dielectric property such as dielectric constant and dielectric loss, of the dielectric film (4) by comparison to a reference value.

* * * * *